United States Patent
Ohba et al.

(10) Patent No.: US 6,543,035 B2
(45) Date of Patent: Apr. 1, 2003

(54) LCR EXTRACTION METHOD AND COMPUTER PROGRAM FOR PERFORMING LCR EXTRACTION IN LSI DESIGN PROCESS

(75) Inventors: Hisayoshi Ohba, Kawasaki (JP); Jun Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/901,604

(22) Filed: Jul. 11, 2001

(65) Prior Publication Data

US 2002/0124229 A1 Sep. 5, 2002

(30) Foreign Application Priority Data

Mar. 2, 2001 (JP) ........................................ 2001-057981

(51) Int. Cl.[7] .................................................. G06F 9/45
(52) U.S. Cl. .................................... 716/5; 716/4; 716/6
(58) Field of Search ........................ 716/4, 5, 6, 8, 716/10, 11

(56) References Cited

U.S. PATENT DOCUMENTS

| | | | | |
|---|---|---|---|---|
| 5,706,206 A | * | 1/1998 | Hammer et al. ................. | 716/4 |
| 5,706,477 A | * | 1/1998 | Goto ............................. | 703/14 |
| 5,838,582 A | * | 11/1998 | Mehrotra et al. ............... | 716/5 |
| 5,901,063 A | * | 5/1999 | Chang et al. ................... | 716/4 |
| 6,061,508 A | * | 5/2000 | Mehrotra et al. ............... | 716/6 |
| 6,128,768 A | * | 10/2000 | Ho ................................ | 716/5 |
| 6,175,947 B1 | * | 1/2001 | Ponnapalli et al. ............ | 716/5 |
| 6,330,704 B1 | * | 12/2001 | Ljung et al. ................... | 716/5 |

FOREIGN PATENT DOCUMENTS

JP 11026588 A * 1/1999

* cited by examiner

*Primary Examiner*—Son Mai
(74) *Attorney, Agent, or Firm*—Staas & Halsey LLP

(57) ABSTRACT

The present invention relates to an LCR extraction method for extracting LCR values from layout data having wiring pattern data in a plurality of wiring layers. The method has the steps of: generating the LCR values, for a wiring pattern, based on the layout data; finding the pattern congestion level in an area of the wiring pattern; and correcting the LCR values, based on pattern fluctuation values depending on the pattern interval between the wiring pattern and an adjacent pattern. Pattern width fluctuations occur in manufacturing processes in conjunction with the finer miniaturization of layout data, wherefore the precision of extracted LCR values can be enhanced by subjecting the LCR values found from layout data to corrections corresponding to those pattern width fluctuations.

30 Claims, 9 Drawing Sheets

FIG. 6

LCR Parameter Table

| LCR | Matching Data | LCR values | Computation |
|---|---|---|---|
| Ca (area) | d1 | Ca=xx(F/$\mu m^2$) | Ca×W×La |
| | d2 | Ca=yy | |
| | — | — | |
| | dn | Ca=zz | |
| Cc (coupling) | s1 | Cc=xx(F/$\mu m$) | Cc×La |
| | s2 | Cc=yy | |
| | — | — | |
| | sn | Cc=zz | |
| Cf (fringe) | sp1 | Cf=xx(F/$\mu m$) | Cf×La |
| | sp2 | Cf=yy | |
| | — | — | |
| | spn | Cf=zz | |
| R | layer1 | Rs=xx($\Omega$/□) | Rs×La/W |
| | layer2 | Rs=yy | |
| | — | — | |
| | layern | Rs=zz | |
| L | layer1 | Ls=xx(H) | Ls×La/W |
| | layer2 | Ls=yy | |
| | — | — | |
| | layern | Ls=zz | |

Congestion Level Extraction

S1: Chip is devided by n

S2: Extract 1/n

S3: Divide by layers

S4: Determine congestion level

LCR EXTRACTION METHOD AND COMPUTER PROGRAM FOR PERFORMING LCR EXTRACTION IN LSI DESIGN PROCESS

BACKGROUND OF THE INVENTION

1. Field of the Invention

This invention relates to a method for extracting the LCR (inductance, capacitance, and resistance) values of connecting line(s) in semiconductor integrated circuit (hereinafter LSI) design processes and to an LCR extraction program for causing a computer to execute that method, and particularly to a method and program capable of extracting highly precise LCR values of connecting line(s), taking into consideration the fluctuations in pattern width associated with the finer miniaturization of layout patterns.

2. Description of the Related Art

LSI design processes are ordinarily performed on computer CAD. An LSI design process has a logic design process for connecting logic gates to design a logic circuit, a layout design process for laying out that logic circuit on an actual chip, a process for extracting LCR (inductance, capacitance, and resistance) values of laid out connecting lines and determining the delay time for signal paths from the extracted LCR and the AC characteristics of cells and macros, a logic simulation process for checking whether the logic circuit will operate normally using that delay time, and a physical verification process for checking that the layout data satisfies the design rule.

Based on t he layout design, layout data, including wiring pattern data for each layer on the chip, are produced. Based on these layout data, the connecting line LCR values are extracted. The LCR extraction process, delay time computation process, and logic simulation process are generally provided in one program module.

In the LCR extraction process described above, the connecting line resistance R, capacitance C, and inductance L are extracted, either by arithmetic computation or by referencing a parameter table, according to the width of the wiring, the distances to adjacent wiring, and the overlapping area contained in the layout data.

In conjunction with the finer miniaturization of patterns in recent years and due to the influence of manufacturing processes, the actually formed pattern width sometimes differs from the pattern width in the layout data. One manufacturing process thought to affect the pattern width is the connecting line etching process. In processes such as reactive ion etching (RIE), wherein a reaction gas is introduced in a high vacuum atmosphere, a plasma state is induced by applying a high frequency voltage, and a wiring layer of aluminum or the like is etched, a phenomenon is observed whereby the pattern width fluctuates, becoming thinner or thicker, in conjunction with finer pattern miniaturization.

In conjunction with this pattern width fluctuation phenomenon, with a conventional method for extracting LCR values from the layout data, problems are encountered in that accurate LCR values cannot be extracted, the precision of the signal propagation delay time on signal paths determined by the extracted LCR values is low, and suitable logic simulation cannot be effected.

SUMMARY OF THE INVENTION

Thereupon, an object of the present invention is to provide both a new method wherewith it is possible to extract LCR values of connecting lines and the like, taking pattern width fluctuation into consideration, and a computer program for implementing that method.

Another object of the present invention is to provide both a method wherewith accurate LCR value extraction can be performed, even when the LSI design rule has been made even finer, and a computer program for implementing that method.

In order to attain the objects noted above, in one aspect of the present invention, an LCR extraction method for extracting LCR values containing at least one of resistance, capacitance, and inductance, from layout data at least having wiring pattern data in a plurality of wiring layers, has the steps of:

generating the LCR values, for a wiring pattern being looked at, based on the layout data for the wiring pattern being looked at;

finding the pattern congestion level in an area where the wiring pattern being looked at exists, based on the layout data; and correcting the LCR values when the pattern congestion level is higher (more congested) than a prescribed reference value, based on pattern fluctuation values depending on the pattern interval between the wiring pattern being looked at and an adjacent pattern.

Pattern width fluctuations occur in manufacturing processes in conjunction with the finer miniaturization of layout data, wherefore the precision of extracted LCR values can be enhanced by subjecting the LCR values found from layout data to corrections corresponding to those pattern width fluctuations. Accordingly, signal path propagation delay times can be found more accurately using those corrected LCR values, and suitable logic simulations can be performed.

BRIEF DESCRIPTION OF THE DRAWINGS

FIG. 6 is a diagram representing an example parameter table;

DESCRIPTION OF THE PREFERRED EMBODIMENTS

An example of an embodiment of the present invention is now described with reference to the drawings. However, the scope of the protection of this invention is not limited to or by this embodiment aspect example, but extends to the inventions described in the claims and to things equivalent thereto.

Figure 1:
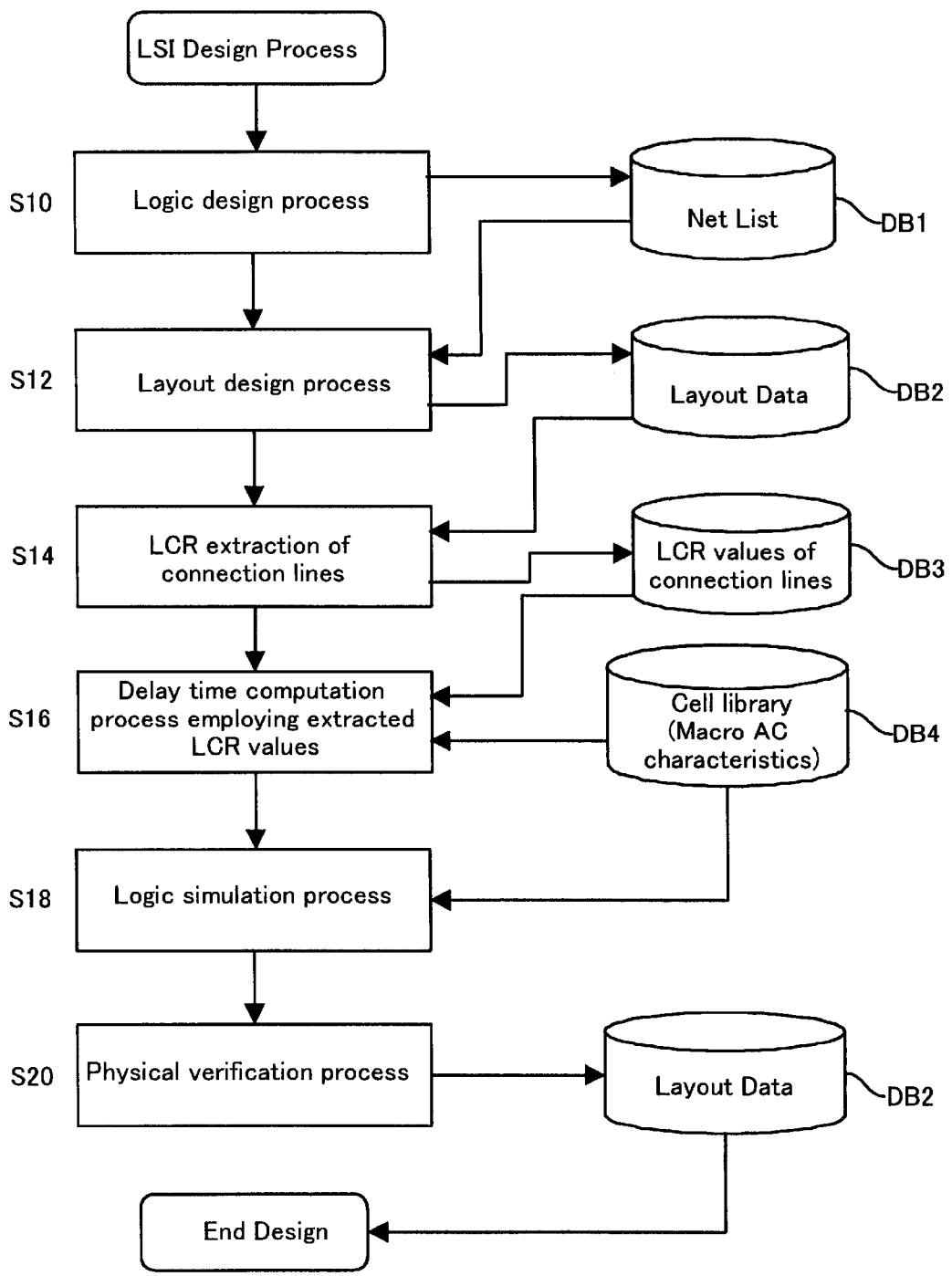
FIG. 1 is a flowchart for an LSI design process in an embodiment of the present invention.

FIG. 1 is a flowchart for an LSI design process in an embodiment aspect of the present invention. As noted earlier, an LSI design process has a logic design process (S10) for connecting logic gates to design a logic circuit, a layout design process (S12) for laying out that logic circuit on an actual chip, an LCR extraction process (S14) for extracting LCR (inductance, capacitance, and resistance) values of laid out connecting line(s), a delay time computation process (S16) for determining the delay time for signal paths from the extracted LCR values and the AC characteristics of cells and macros, a logic simulation process (S18) for checking whether the logic circuit will operate normally using that signal path delay time, and a physical verification process (S20) for checking that the layout data satisfies the design rule.

Figure 2:
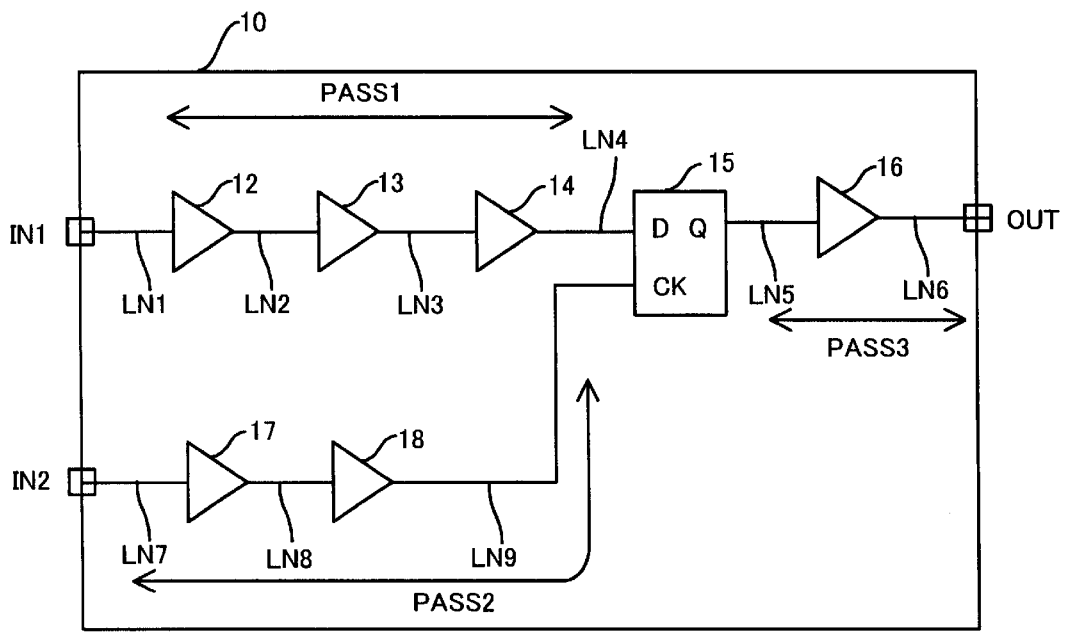
FIG. 2 is a schematic diagram of one example of a logic circuit generated by logic design.

In the logic design process S10, a designer designs a logic circuit having a specific function using CAD tools. As a result, a net list DB1 is generated that consists of cells or macros having logic gates, together with connecting data therefor. When the logic design process is finished, a logic circuit such as that diagrammed in FIG. 2 is completed. Such a logic circuit can be specified by the net list DB1. The example logic circuit diagrammed in FIG. 2 is an example wherein gates 12 to 14 and 16 to 18 and a flip-flop 15 are connected between input terminals IN1 and IN2 and an output terminal OUT in a chip 10. Those gates and flip-flop, respectively, are connected by connecting lines LN1 to LN9.

Next after that logic design process, the layout design process S12 is performed. Here, cells and/or macros are arranged on an actual chip, the connecting lines that connect them are laid out, and layout data DB2 are generated. When the connecting lines are implemented in multi-layer wiring on the chip, layout data DB2 are generated for each wiring layer. Accordingly, the layout data DB2 has wiring pattern data for connecting lines LN1 to LN9 in the logic circuit diagrammed in FIG. 2.

Next, based on the layout data DB2, of the resistance, capacitance, and inductance values for the connecting lines LN1 to LN9, at least one value is extracted (S14). A specific method for this LCR extraction is described subsequently.

Then, based on the extracted connecting line LCR value data DB3 and the AC characteristics of cells and/or macros in a cell library DB4, the signal propagation delay time for the signal paths PASS1 to PASS3 are computed (S16). These cell and/or macro AC characteristics are, in the case of an inverter, for example, output rise and fall characteristics for input rise and fall, and output drive capability, etc.

Figure 3:
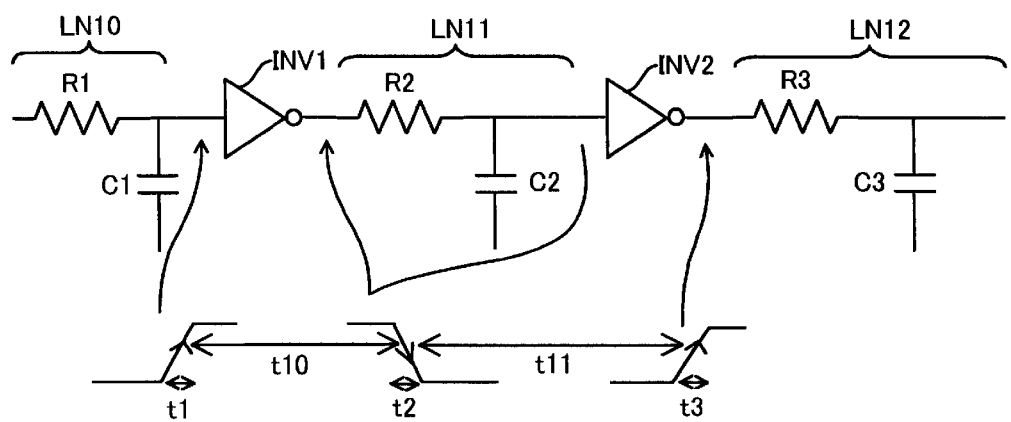
FIG. 3 is a diagram for describing the computation of signal propagation delay time in a signal path.

FIG. 3 is a diagram for describing the computation of signal propagation delay times in signal paths. In this example, inverters INV1 and INV2 are connected in series. In this case, a connecting line LN10 exhibiting a resistance R1 and capacitance C1 is connected to the input terminal of the first-stage inverter INV1. This connecting line LN10 is driven by a previous-stage gate (not shown), and the input signal of the inverter INV1 is a rising waveform having a delay time t1. The delay time t1 of this rising waveform is found from the drive capability of the previous-stage gate and the resistance R1 and capacitance C1 etc. of the connecting line LN10.

Then, at the inverter INV1, for the input rising waveform, the output falls after a certain delay time t10. The output fall characteristics depend on the resistance R2 and capacitance C2 of the connecting line LN11 connected to that output terminal and on the output drive characteristics of the inverter INV1. Similarly, in the inverter INV2 of the next stage also, for the input falling waveform, the output rises after a certain delay time t11. This output rise characteristic t3 is also determined by the drive capability of the inverter INV2 and the resistance R3 and capacitance C3 of line connected to the output.

In this manner, signal propagation delay times can be sequentially computed, along the signal paths, from the LCR values of the connecting lines and the AC characteristics of the cells. As a consequence, in the logic circuit diagrammed in FIG. 2, the signal propagation delay times of the signal paths PASS1, PASS2, and PASS3, respectively, are found. When the inductance of the connecting line is extracted, furthermore, the delay characteristic due thereto can be included in the signal propagation delay time of the signal path.

If the signal propagation delay times of the signal paths are obtained, then logic simulation can be performed to check whether or not that logic circuit will operate normally (S18). In the logic simulation, checks are made as to whether or not the logic circuit operates normally for test input data and whether or not the expected test output data are output. In this case, in the example diagrammed in FIG. 2, checks are made as to whether or not the clock signal input timing to the clock terminal CK of the flip-flop 15 matches the data input timing to the data input terminal D, based on the signal propagation delay times of the signal paths found as noted earlier. That is, it is necessary that the data input D be maintained at a proper level during the setup time and hold time before and after the clock signal CK rise timing. In order to perform this check, the delay times for the signal paths PASS1 and PASS2 must be suitably computed.

Figure 4:
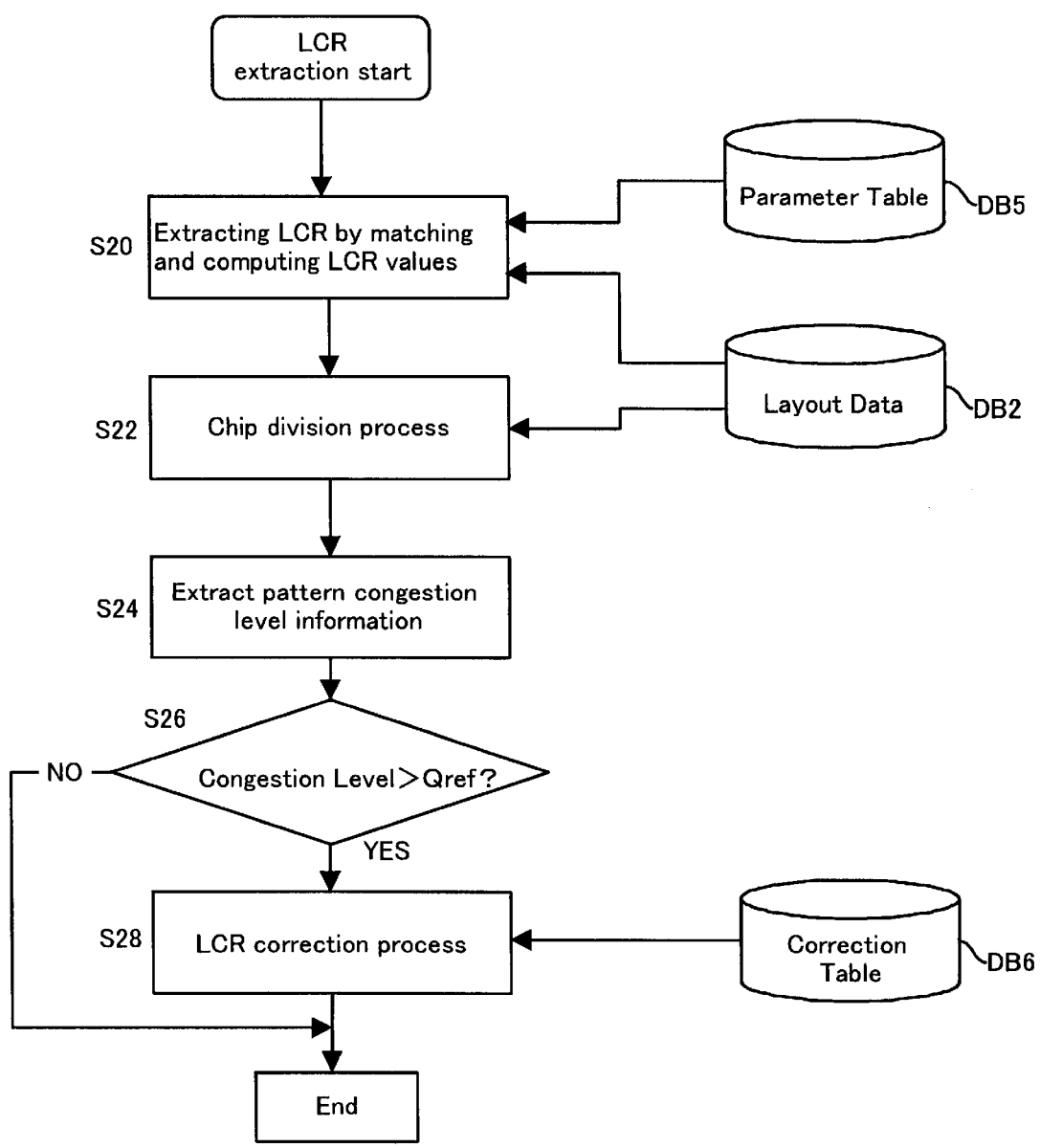
FIG. 4 is a flowchart for an LCR extraction process in an embodiment of the present invention.

The description given above is a rough overview of an LSI design process. Next, the LCR extraction process in this embodiment is described. FIG. 4 is a flowchart for the LCR extraction process. The values resulting from connecting line LCR extraction can be found by arithmetically computing the resistance R, capacitance C, and inductance L of the connecting lines following the layout data DB2. If it is the resistance R, that can be found from the wiring pattern width. If it is the capacitance, that can be found from the distance from the wiring pattern(s) adjacent in the horizontal direction (i.e. the pattern interval) and the area of overlap with the wiring pattern(s) adjacent in the vertical direction. The same is true for the inductance L.

In LCR extraction, however, an enormous amount of computer computation time is required for computing the LCR values of connecting lines, making it unrealistic. That being so, in this embodiment, a parameter table DB5 of LCR values is produced beforehand, and the LCR values are found by referencing that parameter table DB5, whereupon computer computation time is reduced.

Figure 5:
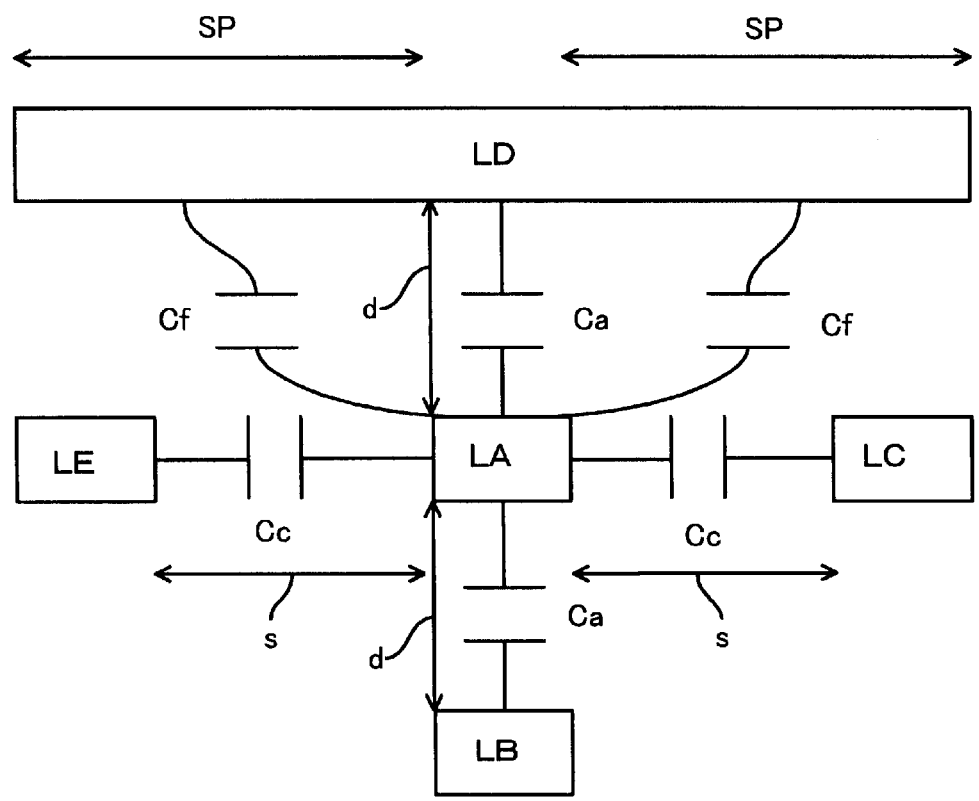
FIG. 5 is a diagram for describing a parameter table.

FIG. 5 is a diagram for describing the parameter table, and FIG. 6 is a diagram that represents an example parameter table. In FIG. 5, wiring patterns LC and LE are deployed adjacent in the horizontal direction to a wiring pattern LA being looked at, which is the subject of LCR value extraction, and wiring patterns LB and LD are deployed adjacent in the vertical direction to the wiring pattern LA being looked at. The wiring pattern LB (or part of LD) overlaps the wiring pattern LA being looked at, generating an area capacitance Ca. This area capacitance Ca changes in dependence on the thickness d of an insulating film between the two wiring patterns LA and LB, and differs in dependence on the length of the wiring pattern LA being looked at and the pattern width.

The wiring patterns LC and LE are separated by the pattern interval s (space) from the wiring pattern LA being looked at, generating coupling capacitances Cc. These coupling capacitances Cc change in dependence on the pattern interval s and differ in dependence on the length of the wiring pattern LA being looked at.

The wiring pattern LD, furthermore, has edge portions SP on both sides thereof which face to the wiring pattern LA being looked, generating fringe (edge) capacitances Cf. These fringe capacitances Cf change in dependence on the length SP of the edge portions, and differ in dependence on the length of the wiring pattern LA being looked at.

The resistance value R and inductance L of the wiring pattern LA being looked at differ from one wiring layer to another, and differ in dependence on the pattern width and/or length of the wiring pattern LA itself that is being looked at.

Thereupon, the parameter table DB5 is configured as diagrammed in FIG. 6. In the case of the area capacitance Ca, for example, per-unit-area capacitances xx, yy, and zz are associated with n different insulation film thicknesses d. Accordingly, the insulating film thickness d in the layout data DB2 is matched with the n different film thicknesses d1 to dn in the parameter table, and the per-unit-area area capacitance Ca ($F/\mu m^2$) for the corresponding film thickness di (where i=1 to n) is extracted. This per-unit-area area capacitance Ca is a parameter for finding the area capacitance, and can be found beforehand. Also, by multiplying the extracted per-unit-area area capacitance Ca by the pattern width W and length (being the length in the vertical direction of the page surface in FIG. 5) La of the wiring pattern LA being looked at, the area capacitance of the wiring pattern LA being looked at can be found. In this manner, the computation of the per-unit-area area capacitance Ca has been finished beforehand, wherefore computer arithmetic computation time in the LCR extraction process can be reduced.

In the case of the coupling capacitance Cc, per-unit-length capacitances are associated with n different pattern intervals s. Accordingly, the pattern interval in the layout data DB2 is matched with the n different pattern intervals s1 to sn in the parameter table, and the corresponding per-unit-length coupling capacitance Cc ($F/\mu m$) is extracted. Thereupon, by multiplying the extracted per-unit-area coupling capacitance Cc by the length La of the wiring pattern LA being looked at, the coupling capacity Cc of the wiring pattern LA being looked at can be found.

In the case of the fringe capacitance Cf, per-unit-length capacitances are associated with n different edge lengths sp1 to spn for the wiring pattern LD. The edge length in the layout data DB2 is matched with the n different edge lengths sp1 to spn in the parameter table, and the corresponding per-unit-length coupling capacitance Cc is extracted. This is multiplied by the length La of the wiring pattern LA being looked at, and the fringe capacitance Cf is found.

Turning to the resistance R, the sheet resistance Rs for each wiring layer in the chip is registered beforehand in the table. Accordingly, if the sheet resistance Rs corresponding to the wiring layer number in the layout data DB2 is extracted, and that is multiplied by the length La of the wiring pattern LA being looked at, and divided by the pattern width W, the resistance value R for the pattern LA will be found. The inductance L is found also by the same method as for the resistance R.

As described in the foregoing, the insulating film thickness d, pattern interval s, and adjacent pattern edge length sp and the like contained in the layout data DB2 are matched with the same data in the parameter table DB5, and the unit capacitances Ca, Cc, Cf, sheet resistance Rs, and inductance Ls corresponding to what was matched are extracted. The actual capacitance values, resistance values, and inductance values are also found from the pattern width and/or length of the wiring pattern LA being looked at.

Returning to FIG. 4, in process S20, the LCR values for the wiring pattern LA being looked at are found by referencing the parameter table DB5, based on the matching data d, s, and sp in the layout data DB2. However, these LCR values will have simply been found using parameter values corresponding to the matching data d, s, and sp in the layout data DB2. When the pattern becomes tighter in conjunction with finer LSI miniaturization, however, in the manufacturing processes, a phenomenon occurs whereby the pattern width becomes thinner or thicker depending on the pattern interval.

What this phenomenon involves is that, in a wiring layer RIE etching process, for example, a layer of transformed resist is formed on a side wall of the wiring pattern, a so-called side-wall protective film is formed, and the width of the wiring pattern becomes thinner or thicker than the design data, depending on whether or not that side-wall protective film exists or not. According to a study conducted by the inventors, under a finely miniaturized design rule, when the pattern interval becomes narrower, the pattern width tends to become narrower, and, conversely, when the pattern interval becomes wider, the pattern width tends to become wider. With a conventional design rule that is not finely miniaturized, on the other hand, the influence of such pattern width fluctuations as described in the foregoing is small enough to disregard.

That being so, in this embodiment, a decision as to whether or not LCR values extracted according to layout data should be corrected is made according to the level of congestion in the area where the wiring pattern being looked at exists. When the congestion level is high (tighter) and it is judged that correction should be made, the pattern width fluctuations are predicted according to the pattern interval, and the LCR values are corrected according to those pattern width fluctuations.

Thereupon, as diagrammed in FIG. 4, in the LCR extraction process, in order to extract the pattern congestion level in the area where the wiring pattern being looked at exists, a chip division processing step S22 for dividing the chip area and also dividing those divisions further into wiring levels, and a process S24 for extracting pattern congestion level information from the layout data of the divided area are performed.

Figure 7:
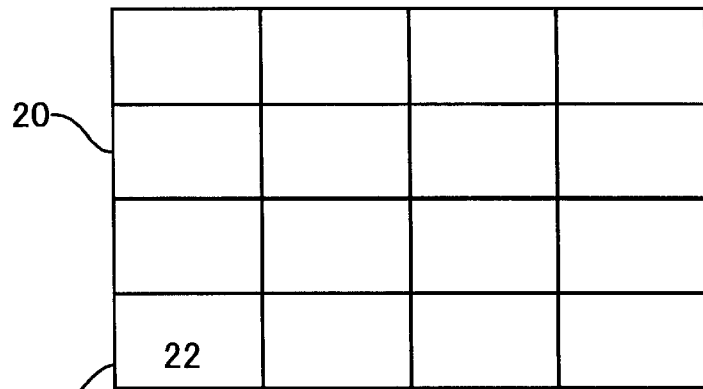
FIG. 7 is a diagram for describing a method for extracting pattern congestion levels.
Figure 7:
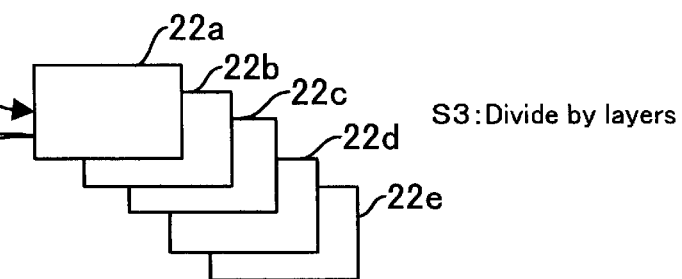
Figure 7:
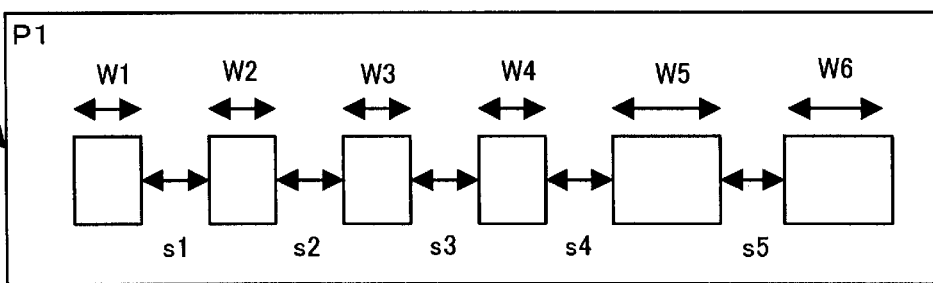
Figure 7:
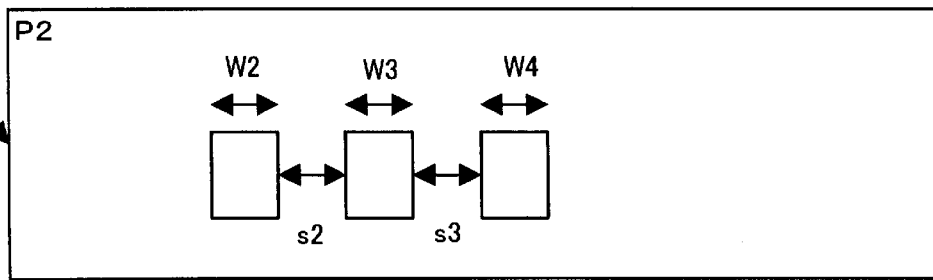

FIG. 7 is a diagram for describing a pattern congestion level extraction method. First, a chip area 20 is divided n times (S1), a 1/n area 22 thus divided is extracted (S2), and further division is made into wiring layers 22a to 22e (S3). Then pattern congestion levels are found for each wiring level in the area(s) divided n times (S4). Possible methods for making n divisions in the chip area 20 include, for example, a method for dividing into areas enclosed by (a) power supply pattern(s) deployed in a mesh pattern, and a method for dividing into areas the number whereof is an integral multiple of the number of wiring channels wherein wiring patterns are deployed.

In FIG. 7, two type s of pattern, P1 and P2, are diagrammed. Both of these patterns P1 and P2 represent wiring pattern cross-sections. With pattern P1, six patterns having the pattern widths W1 to W6 are deployed, respectively, with intervening intervals s1 to s5. With pattern P2, three patterns having the pattern widths W2 to W4 are deployed, respectively, with the intervening intervals s2 and s3.

In this case, in process S26 of FIG. 4, pattern P1 is judged to have a congestion level that is higher than a prescribed reference value Qref (i.e. to be more congested), while pattern P2 is judged to have a congestion level that is lower than the prescribed reference value Qref (i.e. to be less congested). Accordingly, the LCR values for the wiring pattern in pattern P1 will be subjected to correction processing (S28), while the LCR values for the wiring pattern in pattern P2 will not be subjected to correction processing. In this correction processing, a previously produced correction table DB6 is referenced, and corrections are made using correction coefficients in the correction table.

Various methods are conceivable for finding the pattern congestion level. That level can be determined, for example, from the relationship between the maximum number of patterns possible inside the area and the number of actual patterns. Alternatively, using a different method, the congestion level can be determined according to the pattern occupation ratio in the area. In either case, the pattern congestion level in the area where the wiring pattern being looked at exists is found, based on the layout data DB2.

Figure 8:
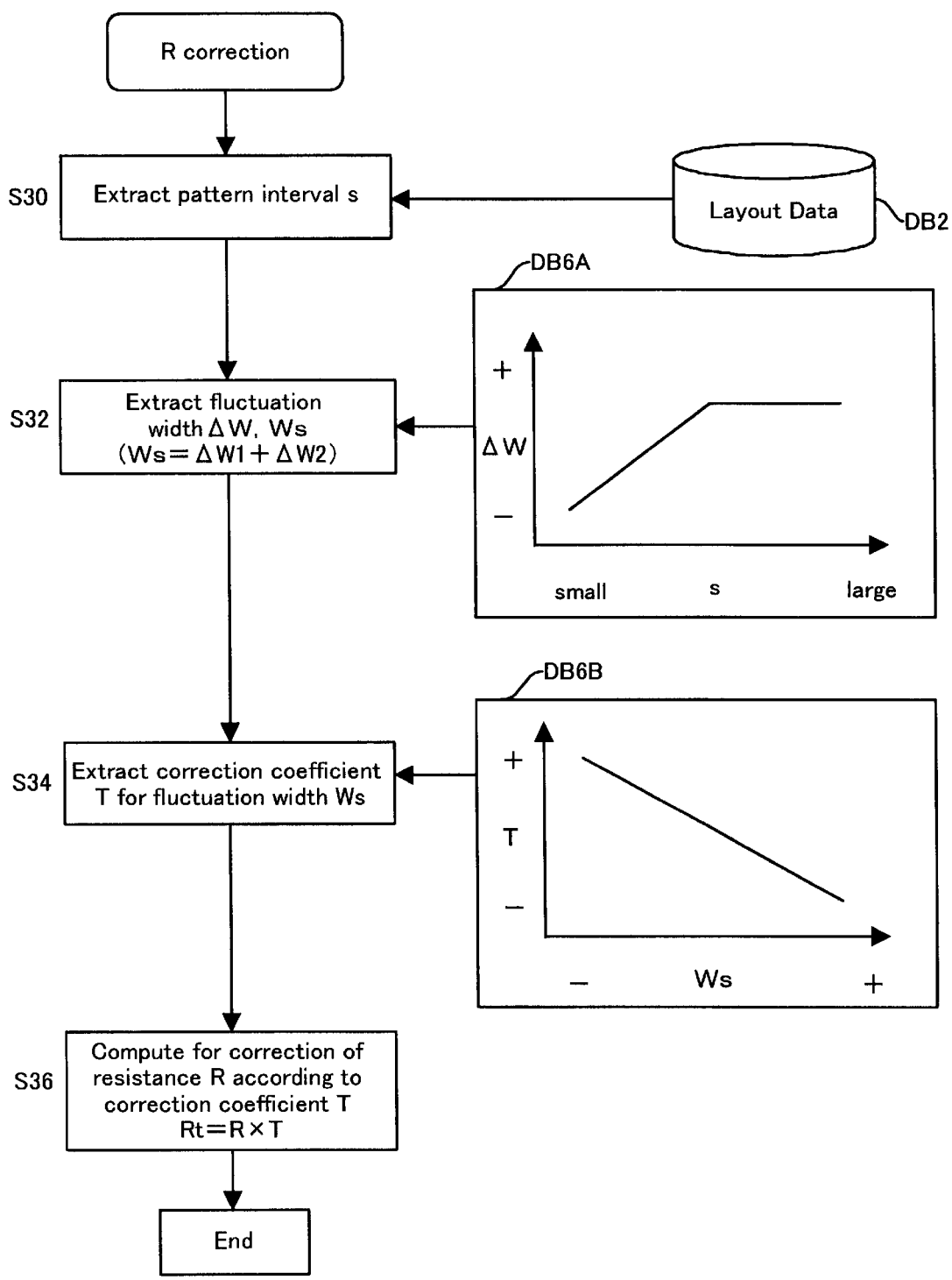
FIG. 8 is a flowchart for an R correction process in an LCR correction process.

FIG. 8 is a flowchart for an R correction process in the LCR correction process. The correction table DB6 that is referenced in the correction process is configured by a first table DB6A that indicates pattern width fluctuations ΔW that correspond to the wiring pattern interval s, and a second table DB6B that indicates correction coefficients T corresponding to the overall fluctuation width Ws for the wiring.

In the correction process, the pattern interval s for the patterns on both sides of the wiring pattern being looked at is extracted from the layout data DB2 (S30). As indicated in the correction table DB6A, the width of the wiring pattern(s) become thinner (ΔW=−) or thicker (ΔW=+) depending on the wiring pattern interval S. That is, if the interval s becomes narrower, the width of that interval side becomes thinner. Accordingly, fluctuation widths ΔW1 and ΔW2 on both sides of the wiring pattern being looked at are extracted from the table DB6A in correspondence with the interval s on both sides, those are added, and the overall fluctuation width Ws for the wiring pattern being looked at is found (S32).

Furthermore, the correction coefficient T that corresponds to the fluctuation width Ws is extracted from the second table DB6B (S34). As indicated in the second table DB6B, if the fluctuation width Ws is in the plus direction, that means that the pattern width has increased, wherefore the correction coefficient T decreases. If the fluctuation width Ws is in the minus direction, that means that the pattern width has decreased, wherefore the correction coefficient T increases.

Here, the correction computation for the resistance R, Rt=R×T, is performed according to the correction coefficient T (S36). Thus the correction of the resistance value associated with the fluctuation of the width of the wiring pattern being looked at due to the influence of the process is performed, and a more accurate resistance value Rt is found.

Figure 9:
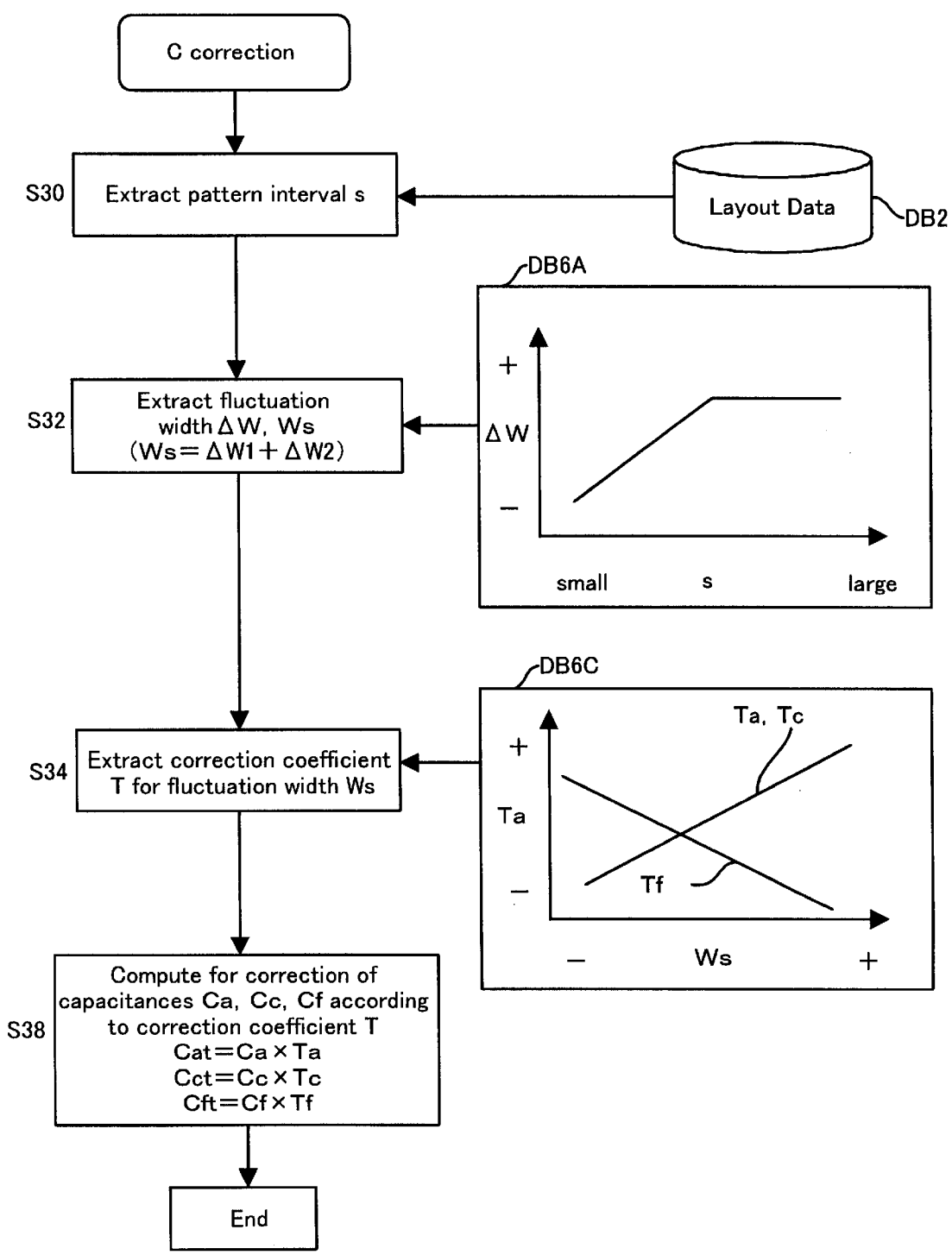
FIG. 9 is a flowchart for a C correction process in an LCR correction process.

FIG. 9 is a flowchart for the C correction process in the LCR correction process. The same process numbers are applied to the same processes as in FIG. 8. In the capacitance correction process, the interval s on both sides of the wiring pattern being looked at is extracted from the layout data DB2 (S30), the first correction table DB6A is referenced, the fluctuation widths ΔW1 and ΔW2 corresponding to the interval s are extracted, and the overall fluctuation width Ws for the wiring is found (S32). The second correction table DB6C is also referenced, and the correction coefficients Ta, Tc, and Tf, respectively, corresponding to the fluctuation width Ws of the wiring pattern being looked at are extracted (S34).

As indicated in the second correction table DB6C, the correction coefficient Ta for the area capacitance Ca is set so that it increases if the fluctuation width Ws is in the plus direction, because then the area of overlapping with the wiring above and below becomes larger, and is set so that it decreases, conversely, if the fluctuation width Ws is in the minus direction. As to the correction coefficient Tc for the coupling capacitance Cc, if the fluctuation width Ws is in the plus direction, then the pattern interval with the adjacent wiring patterns decreases and the capacitance increases, wherefore the correction coefficient Tc is set so as to increase, whereas, if the fluctuation width Ws is in the minus direction, the correction coefficient Tc is set so as to decrease. And as to the correction coefficient Tf for the fringe capacitance Cf, if the fluctuation width Ws is in the plus direction, the length SP of the edge part of the wiring above becomes shorter and the capacitance decreases, wherefore the correction coefficient Tf decreases, whereas, if the fluctuation width Ws is in the minus direction, the correction coefficient Tf increases.

When the second correction table DB6C is referenced, and the correction coefficients Ta, Tc, and Tf for the respective capacitances are extracted, correction computations for the capacitances Ca, Cc, and Cf are performed according to those correction coefficients (S38). As a result, capacitance values Cat, Cct, and Cft can be obtained that exhibit higher precision after taking the influence of the process into consideration.

Figure 10:
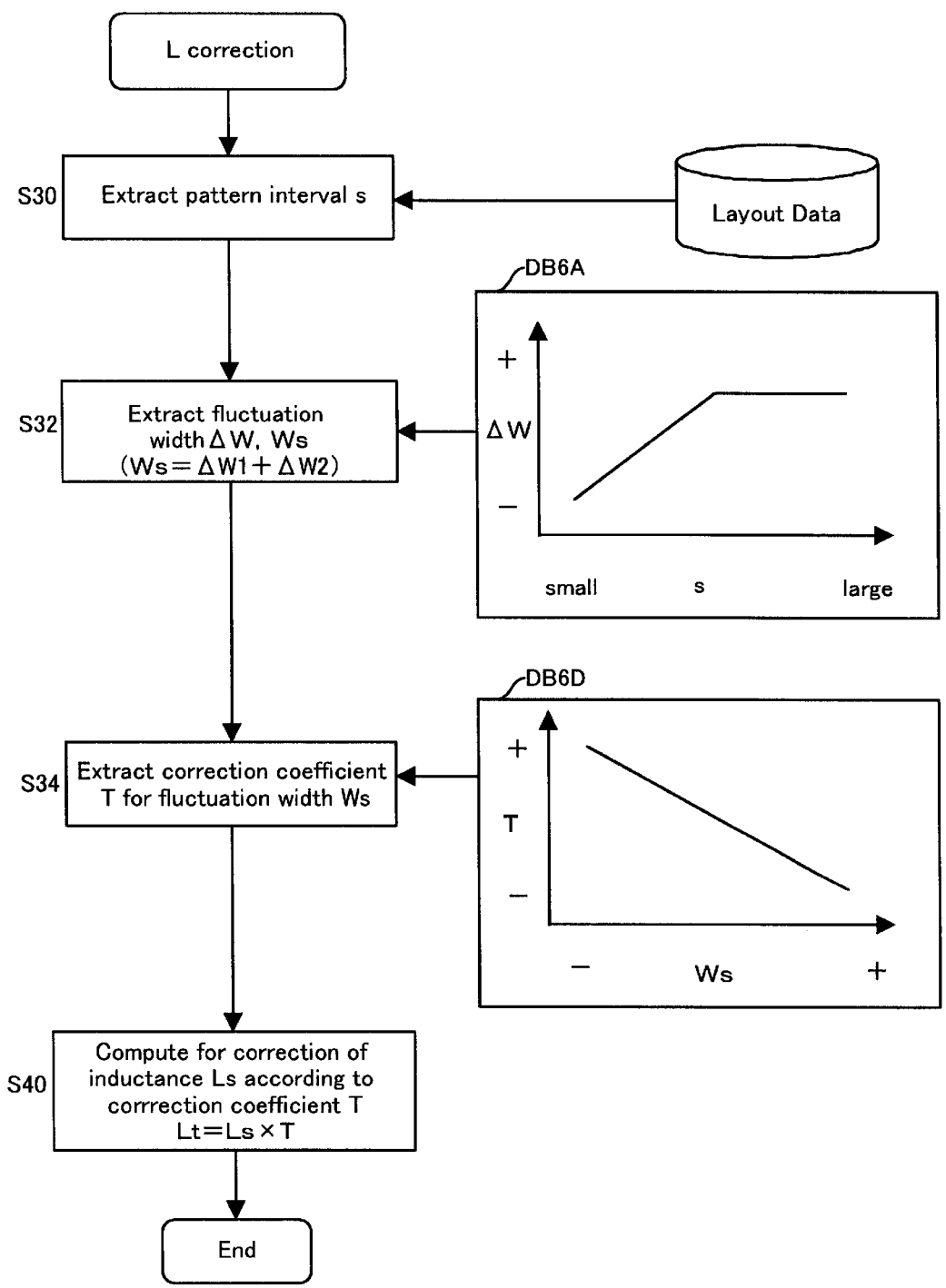
FIG. 10 is a flowchart for an L correction process in an LCR correction process.

FIG. 10 is a flowchart for the L correction process in the LCR correction process. In the case of the inductance L also, similarly, the fluctuation width Ws for the wiring pattern being looked at is extracted from the first correction table DB6A (S32), and the correction coefficient T is extracted from the second correction table DB6D (S34). The correction coefficient T in the case of the inductance L, as in the case of the resistance R, decreases if the fluctuation width Ws is in the plus direction and increases if the fluctuation width Ws is in the minus direction. Also, correction computation for the inductance L is performed according to the correction coefficient (S40). As a result, an inductance value Lt can be obtained that is more accurate after taking the influence of the process into consideration.

The LCR extraction method described in the foregoing, and the logic simulation method inclusive thereof, are usually implemented by an LSI design tool program installed in a work station or the like. Accordingly, the method in this embodiment is effected by a computer program. As there are cases where the program module that implements the LCR extraction method is implemented as one functional module in the LSI design tool program, as noted above, so there are cases where it is implemented as one functional module in the program module that executes logic simulation.

Based on this embodiment, as described in the foregoing, LCR values for wiring patterns can be extracted with good precision so as to cope with fluctuations in the pattern width that depend on how dense or sparse the pattern is.

Based on the present invention, as described in the foregoing, high-precision LCR values can be extracted after giving consideration to pattern width fluctuations induced by the process. Accordingly, in logic simulations, more accurate logic circuit operation checks can be performed.

What is claimed is:

1. An LCR extraction method for extracting LCR values containing at least one of a resistance value, a capacitance value, and an inductance value, from layout data having at least wiring pattern data in a plurality of wiring layers, comprising:

an LCR generation process generating said LCR values for a wiring pattern being looked at, based on said layout data;

a congestion level generation process generating a pattern congestion level in an area where said wiring pattern being looked at exists, based on said layout data; and a correction process correcting said LCR values generated by said LCR generation process, when said pattern congestion level is higher than a prescribed reference value, based on a pattern width fluctuation value depending on pattern interval between the wiring pattern being looked at and an adjacent pattern.

2. The LCR extraction method according to claim 1, wherein, in said congestion level generation process, said pattern congestion level is generated for each wiring layer for areas resulting from fine division of a chip area.

3. The LCR extraction method according to claim 2, wherein, in said congestion level generation process, said pattern congestion level is generated according to a number of patterns or a pattern occupation ratio in said finely divided areas.

4. The LCR extraction method according to claim 1, wherein said pattern width fluctuation value is determined so that pattern width becomes narrower when said pattern interval becomes narrower.

5. The LCR extraction method according to claim 1, wherein, in said correction process, said resistance value is corrected so as to become larger when said pattern width becomes narrower, said capacitance value is corrected so as to become smaller when said pattern width becomes narrower, and said inductance value is corrected so as to become larger when said pattern width becomes narrower.

6. The LCR extraction method according to claim 1, wherein said pattern width fluctuation value is determined so that said pattern width becomes wider when said pattern interval becomes wider.

7. The LCR extraction method according to claim 1, wherein, in said correction process, said resistance value is corrected so as to become smaller when said pattern width becomes wider, said capacitance value is corrected so as to become larger when said pattern width becomes wider, and said inductance value is corrected so as to become smaller when said pattern width becomes wider.

8. A LCR extraction procedure computer program product for causing a computer to execute LCR extraction procedures for extracting LCR values including at least one of a resistance value, a capacitance value, and an inductance value, from layout data having at least wiring pattern data in a plurality of wiring levels, wherein said LCR extraction procedures comprise:

an LCR generation routine generating said LCR values, for a wiring pattern being looked at, based on said layout data;

a congestion level generation routine generating a pattern congestion level in an area where said wiring pattern being looked at exists, based on said layout data; and a correction routine correcting said LCR values generated by said LCR generation routine, when said pattern congestion level is higher than a prescribed reference value, based on pattern width fluctuation values depending on a pattern interval between the wiring pattern being looked at and an adjacent pattern.

9. The LCR extraction procedure computer program product according to claim 8, wherein, in said congestion level generation process, said pattern congestion level is generated for each wiring layer for areas resulting from a fine division of a chip area, and according to a number of patterns or a pattern occupation ratio in said finely divided areas.

10. The LCR extraction procedure computer program product according to claim 8, wherein said pattern width fluctuation value is determined so that pattern width becomes narrower when said pattern interval becomes narrower.

11. The LCR extraction procedure computer program product according to claim 8, wherein, in said correction routine, said resistance value is corrected so as to become larger when said pattern width becomes narrower, said capacitance value is corrected so as to become smaller when said pattern width becomes narrower, and said inductance value is corrected so as to become larger when said pattern width becomes narrower.

12. A logic simulation method for performing logic circuit simulations based on data for a logic circuit in which a plurality of cells are connected by wiring and on layout data having at least wiring pattern data in a plurality of wiring layers, comprising:

an LCR extraction process extracting LCR values including at least one of a resistance value, a capacitance value and an inductance value based on the layout data, having:

(1) an LCR generation process generating said LCR values for a wiring pattern being looked at, based on said layout data;

(2) a congestion level generation process generating a pattern congestion level in an area where said wiring pattern being looked at exists, based on said layout data; and (3) a correction process correcting said LCR values generated by said LCR generation process when said pattern congestion level is higher than a prescribed reference value, based on a pattern width fluctuation value depending on a pattern interval between the wiring pattern being looked at and an adjacent pattern;

a process finding signal path delay times in said logic circuit, based on said LCR values for wiring patterns found in said LCR extraction process and on input/output characteristics of said plurality of cells; and an operation checking process checking operation of said logic circuit using said signal path delay times.

13. The logic simulation method according to claim 12, wherein, in said congestion level generation process, said pattern congestion level is generated for each wiring layer for areas resulting from fine division of a chip area.

14. The logic simulation method according to claim 13, wherein, in said congestion level generation process, said pattern congestion level is generated according to a number of patterns or a pattern occupation ratio in said finely divided areas.

15. The logic simulation method according to claim 12, wherein said pattern width fluctuation value is determined so that said pattern width becomes narrower when said pattern interval becomes narrower.

16. The logic simulation method according to claim 12, wherein, in said correction process, said resistance value is corrected so as to become higher when said pattern width becomes narrower, said capacitance value is corrected so as to become smaller when said pattern width becomes narrower, and said inductance value is corrected so as to become larger when said pattern width becomes narrower.

17. A logic simulation program product for causing a computer to execute logic circuit simulation procedures based on data for a logic circuit in which a plurality of cells are connected by wiring and on layout data having at least wiring pattern data in a plurality of wiring layers wherein said simulation procedures comprise:

LCR extraction procedures extracting LCR values including at least one of a resistance value, a capacitance value and an inductance value based on the layout data, having:
(1) an LCR generation process generating said LCR values, for a wiring pattern being looked at, based on said layout data;
(2) a congestion level generation process generating a pattern congestion level in an area where said wiring pattern being looked at exists, based on said layout data; and
(3) a correction process correcting said LCR values generated by said LCR generation process when said pattern congestion level is higher than a prescribed reference value, based on a pattern width fluctuation value depending on a pattern interval between the wiring pattern being looked at and an adjacent pattern;

a procedure finding signal path delay times in said logic circuit, based on said LCR values for wiring patterns found in said LCR extraction process and on input/output characteristics of said plurality of cells; and an operation checking procedure checking operation of said logic circuit using said signal path delay times.

18. The logic simulation program product according to claim 17, wherein, in said congestion level generation process, said pattern congestion level is generated for each wiring layer for areas resulting from a fine division of a chip area, and according to a number of patterns or a pattern occupation ratio in said finely divided areas.

19. The logic simulation program product according to claim 17, wherein said pattern width fluctuation value is determined so that said pattern width becomes narrower when said pattern interval becomes narrower.

20. The logic simulation program product according to claim 17, wherein, in said correction routine, said resistance is corrected so as to become larger when said pattern width becomes narrower, said capacitance value is corrected so as to become smaller when said pattern width becomes narrower, and said inductance value is corrected so as to become larger when said pattern width becomes narrower.

21. An LCR extraction method for extracting LCR values containing at least one of a resistance value, a capacitance value, and an inductance value, from layout data having at least wiring pattern data in a plurality of wiring layers, comprising:

an LCR generationg process generating said LCR values for a wiring pattern being looked at, based on said layout data; and a correction process correcting said LCR values generated by said LCR generation process, based on a pattern width fluctuation value depending on a pattern interval between the wiring pattern being looked at and an adjacent pattern.

22. The LCR extraction method according to claim 21, wherein said pattern width fluctuation value is determined so that pattern width becomes narrower when said pattern interval becomes narrower.

23. The LCR extraction method according to claim 21, wherein, in said correction process, said resistance value is corrected so as to become larger when said pattern width becomes narrower, said capacitance value is corrected so as to become smaller when said pattern width becomes narrower, and said inductance value is corrected so as to become larger when said pattern width becomes narrower.

24. The LCR extraction method according to claim 21, wherein said pattern width fluctuation value is determined so that the pattern width becomes wider when said pattern interval becomes wider.

25. The LCR extraction method according to claim 21, wherein, in said correction process, said resistance value is corrected so as to become smaller when said pattern width becomes wider, said capacitance value is corrected so as to become larger when said pattern width becomes wider, and said inductance value is corrected so as to become smaller when said pattern width becomes wider.

26. An LCR extraction procedure computer program product for causing a computer to execute LCR extraction procedures for extracting LCR values including at least one of a resistance value, a capacitance value, and an inductance value, from layout data having at least wiring pattern data in a plurality of wiring levels, wherein said LCR extraction procedures comprise:

an LCR generation routine said LCR values for a wiring pattern being looked at, based on said layout data;

a correction routine correcting said LCR values generated by said LCR generation routine based on a pattern width fluctuation value depending on a pattern interval between the wiring pattern being looked at and an adjacent pattern.

27. A logic simulation method for performing logic circuit simulations based on data for a logic circuit in which a plurality of cells are connected by wiring and on layout data having at least wiring pattern data in a plurality of wiring layers, comprising:

an LCR extraction process extracting LCR values including at least one of a resistance value, a capacitance value and an inductance value based on the layout data, having:
(1) an LCR generation process generating said LCR values for a wiring pattern being looked at, based on said layout data; and
(2) a correction process correcting said LCR values generated by said LCR generation process based on a pattern width fluctuation value depending on a pattern interval between the wiring pattern being-looked at and an adjacent pattern;

a process finding signal path delay times in said logic circuit; based on said LCR values for wiring patterns found in said LCR extraction process and on input/output characteristics of said plurality of cells; and an operation checking process checking operation of said logic circuit using said signal path delay times.

28. The logic simulation method according to claim 27, wherein said pattern width fluctuation value is determined so that said pattern width becomes narrower when said pattern interval becomes narrower.

29. The logic simulation method according to claim 27 wherein, in said correction process, said resistance value is corrected so as to become larger when said pattern width becomes narrower, said capacitance value is corrected so as to become smaller when said pattern width becomes narrower, and said inductance value is corrected so as to become larger when said pattern width becomes narrower.

30. A logic simulation program product for causing a computer to execute logic circuit simulation procedures based on data for a logic circuit in which a plurality of cells are connected by wiring and on layout data having at least wiring pattern data in a plurality of wiring layers wherein said simulation procedures comprise:

LCR extraction procedures extracting LCR values including at least one of a resistance value, a capacitance value and an inductance value based on the layout data, having:

(1) an LCR generation process generating said LCR values for a wiring pattern being looked at, based on said layout data; and (2) a correction process correcting said LCR values generated by said LCR generation process based on a pattern width fluctuation value depending on a pattern interval between the wiring pattern being looked at and an adjacent pattern;

a procedure finding signal path delay tames in said logic circuit, based on said LCR values, for wiring patterns found in said LCR extraction process and on input/output characteristics of said plurality of cells; and an operation checking procedure checking operation of said logic circuit using said signal path delay times.

* * * * *

UNITED STATES PATENT AND TRADEMARK OFFICE
CERTIFICATE OF CORRECTION

PATENT NO.    : 6,543,035 B1
DATED         : April 1, 2003
INVENTOR(S)   : Hisayoshi Ohba et al.

It is certified that error appears in the above-identified patent and that said Letters Patent is hereby corrected as shown below:

<u>Column 11,</u>
Line 12, delete "," (first occurrence).

Signed and Sealed this

Tenth Day of June, 2003

JAMES E. ROGAN
*Director of the United States Patent and Trademark Office*